(12) United States Patent
Brunn et al.

(10) Patent No.: US 6,977,959 B2
(45) Date of Patent: Dec. 20, 2005

(54) CLOCK AND DATA RECOVERY PHASE-LOCKED LOOP

(75) Inventors: Brian T. Brunn, Austin, TX (US); Ahmed Younis, Austin, TX (US); Shahriar Rokhsaz, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 217 days.

(21) Appl. No.: 10/346,435

(22) Filed: Jan. 17, 2003

(65) Prior Publication Data

US 2004/0141577 A1  Jul. 22, 2004

(51) Int. Cl.[7] .............................. H04B 1/38; H03D 3/24
(52) U.S. Cl. ...................... 375/219; 375/374; 375/375; 375/376
(58) Field of Search ................................ 375/295, 316, 375/219, 371, 373–376, 355; 327/141, 155, 156–159, 160–163

(56) References Cited

U.S. PATENT DOCUMENTS

| 5,329,559 A | * | 7/1994 | Wong et al. ................ 375/373 |
| 5,483,558 A | * | 1/1996 | Leon et al. ................ 375/376 |
| 6,034,554 A | | 3/2000 | Francis et al. |
| 6,356,160 B1 | | 3/2002 | Robinson et al. |
| 2002/0021470 A1 | | 2/2002 | Savoj |
| 2003/0001557 A1 | | 1/2003 | Pisipaty |

OTHER PUBLICATIONS

Jafar Savoj, Behzad Razavi; "A 10–Gb/s CMOS Clock and Data Recovery Circuit with a Half–Rate Linear Phase Detector"; IEEE 2001; IEEE Journal of Solid–State Circuits, vol. 36, No. 5; May 2001; pp. 761–767.

* cited by examiner

*Primary Examiner*—Tesfaldet Bocure
(74) *Attorney, Agent, or Firm*—Timothy Markison; Kim Kanzaki

(57) ABSTRACT

A clock recovery circuit that operates at a clock speed equal to one-half the input data rate is presented. The clock recovery circuit uses dual input latches to sample the incoming serial data on both the rising edge and falling edge of a half-rate clock signal to provide equivalent full data rate clock recovery. The clock recovery circuit functions to maintain the half-rate clock transitions in the center of the incoming serial data bits. The clock recovery circuit includes a phase detector, charge pump, controlled oscillation module and a feedback module. The phase detector produces information on the phase and data transitions in the incoming data signal to the charge pump. Generally, the circuit is delay insensitive and receives phase and transition information staggered relative to each other.

32 Claims, 11 Drawing Sheets clock recovery circuit 10 phase detector 14 phase detector timing diagrams charge pump 16

Superposition circuitry first signal component sinks current

Superposition circuitry second signal component sources current

Superposition circuitry third signal component sources current

Superposition circuitry fourth signal component provides zero current transceiver 100 transceiver 100

CLOCK AND DATA RECOVERY PHASE-LOCKED LOOP

BACKGROUND OF THE INVENTION

1. Technical Field

This invention relates generally to communication systems and more particularly to clock recovery circuits used therein.

2. Description of Related Art

Communication systems are known to transport large amounts of data between a plurality of end user devices, which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, requires 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information. Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for the feedback loop to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for wide spread use.

What is needed, therefore, is an apparatus that can receive high-speed serial transmissions and provide the received serial data to parallel devices at data rates that ensure data integrity and can be obtained with cost-conscious technology.

BRIEF SUMMARY OF THE INVENTION

A clock recovery circuit that operates at a clock speed equal to one-half the input data rate is presented to improve phase and transition alignment limitations. The clock recovery circuit uses dual input latches to sample incoming serial data on both the rising edge and falling edge of a half-rate feedback signal to provide equivalent full data rate clock and data recovery. The clock and data recovery circuit functions to maintain the half-rate feedback signal transitions in a desired timing relationship to the incoming serial data bits (e.g., substantially near the center of the incoming data). The clock and data recovery circuit includes a phase detector, a charge pump, a controlled oscillation module, and a feedback module. The phase detector produces information about the phase and transitions in an input data signal to the charge pump. The phase information indicates how well the feedback signal is aligned with the input data signal. The transition information indicates a change in logic levels between two successive data bits. The charge pump, which includes superposition circuitry and an output module, generates a first signal component when the phase information is in a first state, a second signal component when the phase information is in a second state, a third signal component when the transition information is in the first state, and a fourth signal component when the transition information is in the second state, wherein the first, second, third, and fourth signal components are current signals in one embodiment of the invention.

The output module, operably coupled to receive the first, second, third, and fourth signal components, generates an error signal from the first, second, third, and fourth current components.

An oscillation module is operably coupled to convert the error signal into an oscillating signal. The feedback module is operably coupled to generate the feedback signal based on the oscillating signal and a divider value.

The preferred embodiment of the invention uses a delay insensitive architecture that does not require phase and transition alignment thereby overcoming limitations of the prior art.

DETAILED DESCRIPTION OF THE INVENTION

Figure 1:
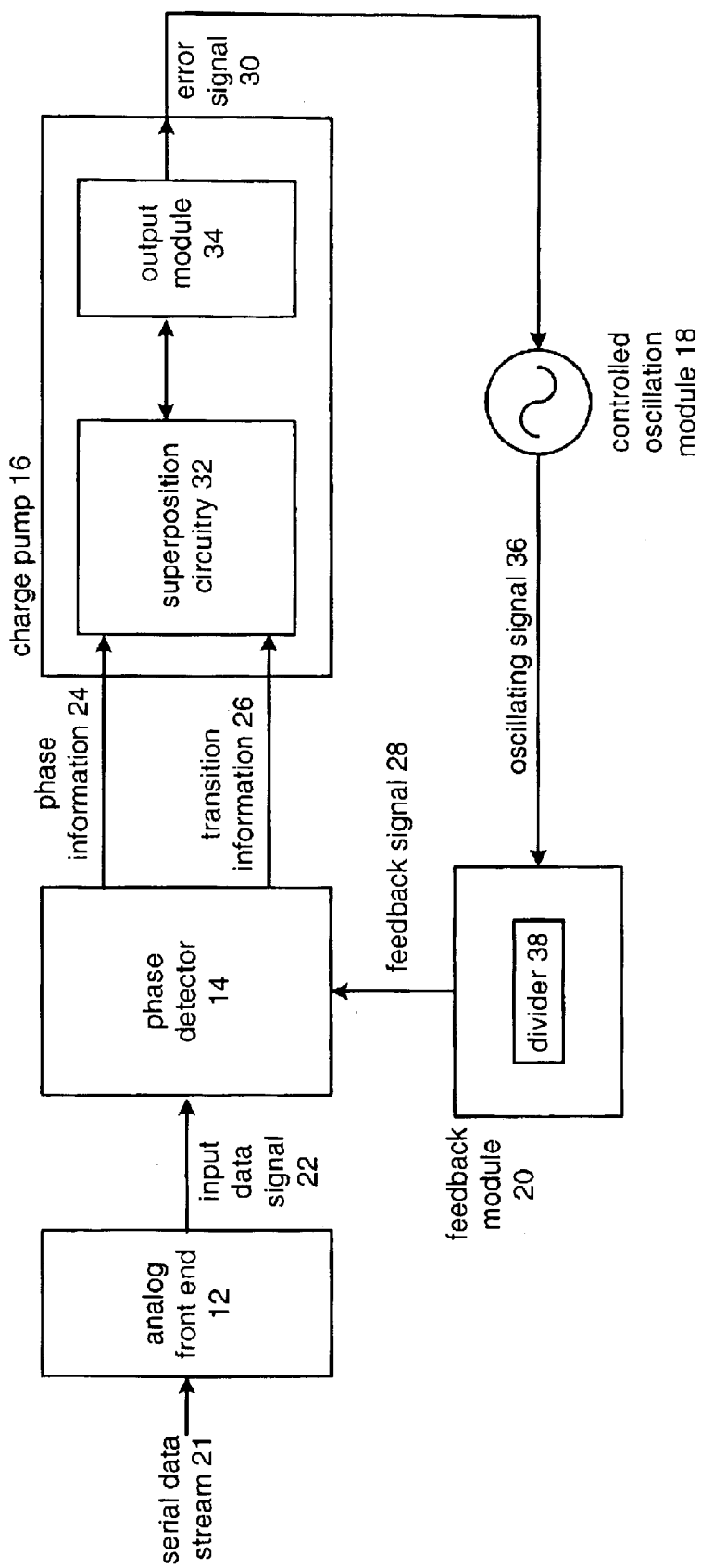
FIG. 1 illustrates a block diagram of a clock recovery circuit in accordance with an embodiment of the present invention.

FIG. 1 illustrates a block diagram of a clock and/or data recovery circuit 10 in accordance with the preferred embodiment of the present invention. The clock recovery circuit 10 includes an analog front end 12, a phase detector 14, a charge pump 16, a controlled oscillation module 18, and a feedback module 20. Charge pump 16 includes superposition circuitry 32 and an output module 34.

Analog front end 12 receives a serial data stream 21, which may be a high data rate bit stream transferring data at 10 or more gigabits per second. This high data rate usually results in some loss of high frequency components of the bit stream due to the limited bandwidth of the input line. Analog front end 12 provides amplitude equalization to produce input data signal 22. Phase detector 14 produces phase information 24 and transition information 26 based on the input data signal 22 and a feedback signal 28. Operation of phase detector 14 will be discussed in greater detail with reference to FIG. 2. Charge pump 16 produces an error signal 30 based on the phase information 24 and transition information 26. Operation of charge pump 16 will be discussed in greater detail with reference to FIG. 4. The controlled oscillation module 18 receives the error signal 30 and produces therefrom an oscillating signal, which represents the recovered clock signal. Feedback module 20 and divider 38 generate feedback signal 28 by dividing oscillating signal 36 by a divider value, which may be a whole number equal to or greater than one. Feedback module 20 and divider 38 adjust feedback signal 28 to one-half the data rate of the input data signal.

Figure 2:
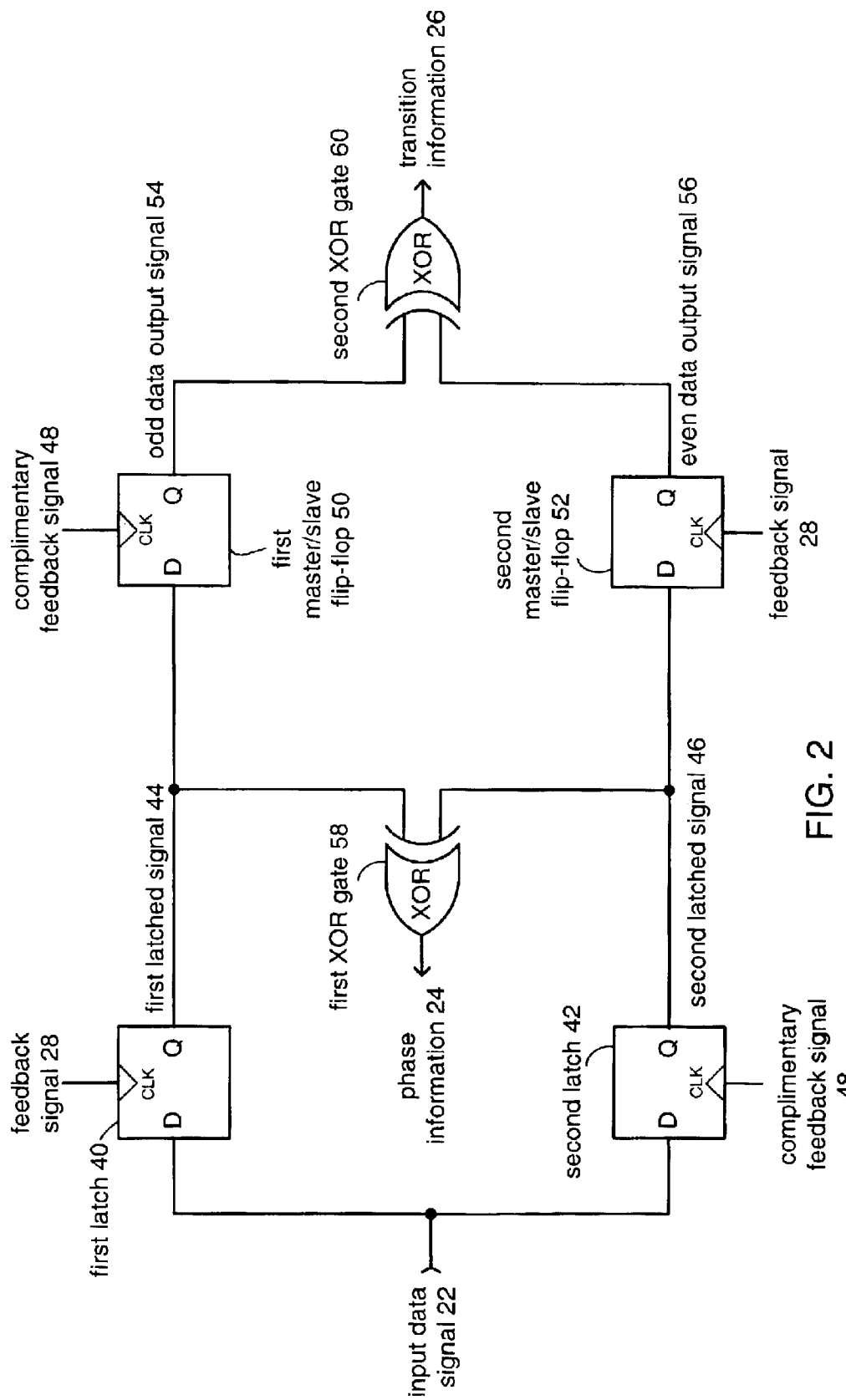
FIG. 2 illustrates a schematic block diagram of a phase detector of the clock recovery circuit of FIG. 1.

FIG. 2 illustrates a schematic block diagram of a phase detector 14 of the clock recovery circuit of FIG. 1. Phase detector 14 functions to produce phase information 24 and transition information 26 based on the relationship between input data signal 22 and feedback signal 28. Generally, phase information 24 reflects a phase relationship of an input signal with respect to the feedback signal while transition information 26 reflects that there has been a logic state change between two successive data bits of the input data. More specifically, phase information 24 is representative of the relative phase difference between input data signal 22 and feedback signal 28. As described previously, the feedback signal is adjusted to one-half the data rate of the input data signal or to another desired fractional rate of the data based on the data recovery scheme.

With the high data rates prevalent in data communications, (e.g., SONET), designing a 10 or greater gigabit per second oscillator is difficult. By using a one-half data rate design and sampling on both the rising and falling edges of the feedback signal, an effective 10 gigabit per second rate is achieved. The data contained in input data signal 22 is essentially random, thus it is just as probable to receive a consecutive series of logic ones or logic zeros as it is to receive an alternating pattern of logic ones and logic zeros. Phase detector 14 produces transition information 26 to indicate a change in logic levels of input data signal 22. Transition information 26 will remain at logic one as long as the input data signal 22 changes states at least once every one-half clock cycle, or 100 pico-seconds for the 5 GHz feedback signal of the present design in a locked condition where data and clock are 90 degrees out of phase, i.e. sampling in middle the data. The transition information will change to a logic zero when the input data signal logic level remains constant, indicating same level consecutive data bits. When there is not a transition on the data, charge pump 16 uses the transition information to prevent controlled oscillation module 18 from erroneously changing frequency on an average.

Continuing with the description of FIG. 2, the input data signal 22 is coupled to a first latch 40 and a second latch 42 to produce a first latched signal 44 and a second latched signal 46, respectively. As is known by one of average skill in the art, latches couple data on an input terminal D to an output terminal Q as long as a CLK terminal on the latch is at logic one and samples the data on the falling edge of the clock (or vice versa). First latch 40 receives feedback signal 28 at the CLK terminal, while second latch 42 receives a complimentary feedback signal 48 at the CLK terminal. Thus, one latch triggers on a rising edge of the feedback signal while the other effectively triggers on a falling edge of the feedback signal.

The first latched signal 44 and second latched signal 46 are further coupled to first exclusive OR (XOR) gate 58 to produce phase information 24. Due to the quadrature sampling of feedback signals (feedback signal 28 and complimentary feedback signal 48) and the first XOR gate 58, phase information 24 will be proportional to the phase difference between input data signal 22 and feedback signal 28. The output thus reflects how far the transition edge of feedback signal 28 (or complimentary feedback signal 48) is from the center of a data bit. The pulse width of phase information 24, when there is a transition in the input data, will be one-half bit period when the feedback signal is centered on the data bit.

First latched signal 44 and second latched signal 46 are coupled to a first master/slave flip-flop 50 and a second master/slave flip-flop 52, respectively. Operation of a master/slave flip-flop differs from operation of a latch in that data on the input terminal D will be sampled during the transition of the CLK signal then the sampled data is coupled to the output terminal Q during the next alternate transition of the CLK signal. Operation of the latch followed by the master/slave flip-flop clocked by complimentary clock signals (feedback signal 28 and complimentary feedback signal 48) serves to produce an output signal composed of alternate bits in the input data signal (half of the full rate). First master/slave flip-flop 50 will produce an odd data output signal 54 while second mater/slave flip-flop 52 will produce an even data output signal 56. One of average skill in the art will recognize that the choice of even and odd is simply a method to describe the contents of the data signal from an arbitrary point in time and should not be construed to mean the actual logic state of the data.

The odd data output signal 54 and even data output signal 56 are coupled to second XOR gate 60 to produce transition information 26. The transition information is indicative of a change in input data signal 22 logic levels. The phase and transition information, as described herein, will be discussed in more detail with respect to FIG. 3.

Figure 3:
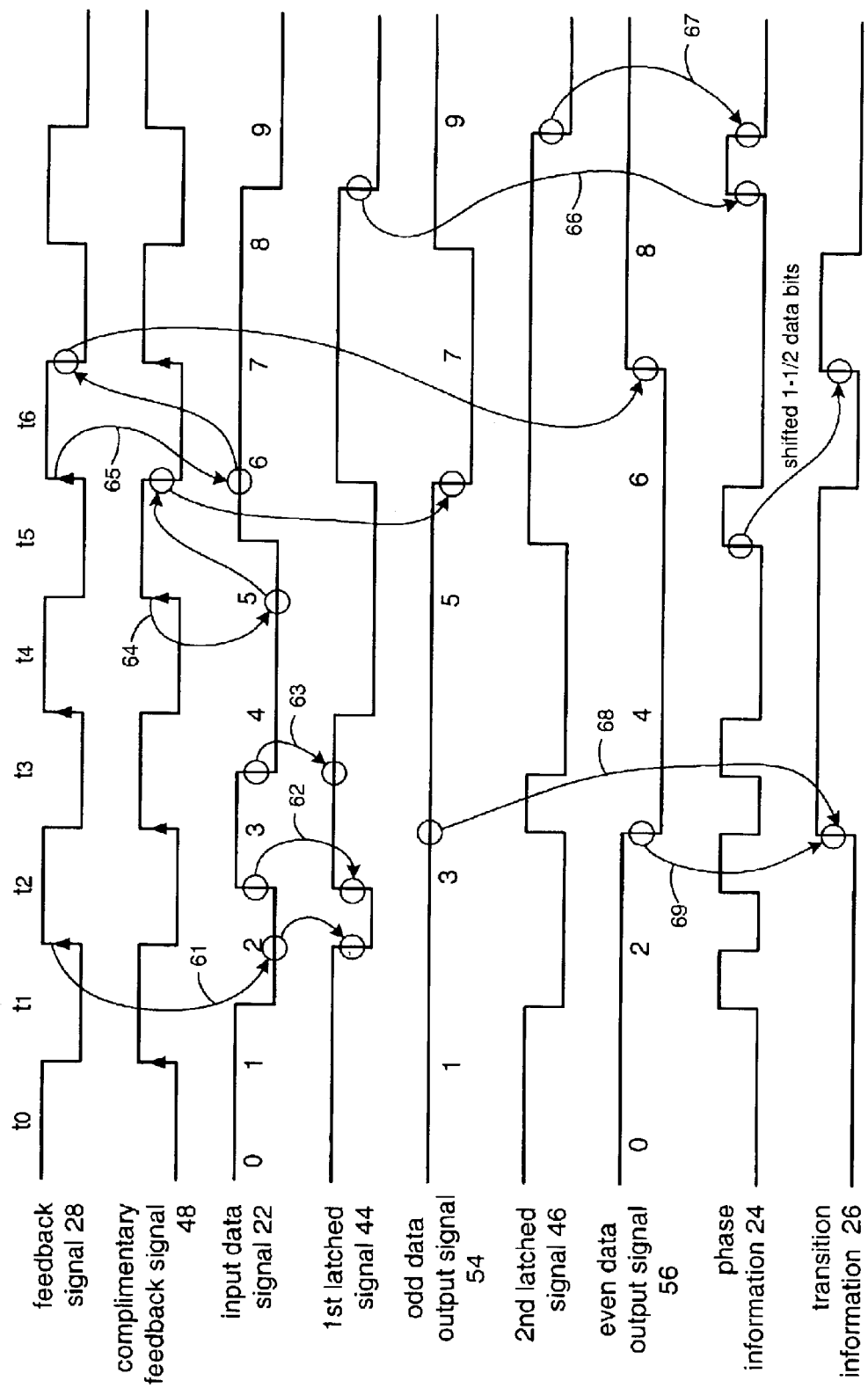
FIG. 3 illustrates a timing diagram for the phase detector of FIG. 2.

FIG. 3 illustrates timing diagrams for the phase detector of FIG. 2. The timing diagrams shown are for single-ended devices to simplify discussion, though one of average skill in the art should recognize that either single-ended or differential signaling may be used. Additionally, the timing diagrams illustrate "perfect" signals with zero rise time, zero fall time, zero propagation delay and no overshoot or undershoot for exemplary purposes. Additionally, small arrows indicate the sampling edge of feedback signal 28 and complimentary feedback signal 48.

Input data signal 22 comprises a random data bit pattern. The data bits are numbered zero through nine for the purposes of discussion and not intended to convey any information regarding the data. Furthermore, the timing diagrams illustrate phase detector 14 locked to input data signal 22 with feedback signal 28 and complimentary feedback signal 48 transitioning in the center of each data bit. First latched signal 44 follows input data signal 22 during the logic one periods of feedback signal 28, time periods t0, t2, t4, etc. Thus, if input data signal 22 transitions from one level to another, such as the transition during time period t2, first latched signal 44 will follow it as long as feedback signal 28 is logic one. For example, at the rising edge of feedback signal 28 at the start of time period t2, first latched signal 44 transitions to logic zero since input data signal 22 is logic zero. Timing line 61 indicates this sequence. When input data signal 22 transitions to logic one, first latched signal 44 also transitions to logic one as indicated by timing line 62. First latched signal 44 holds the logic one level once feedback signal 28 transitions to logic zero at the end of time period t2. As shown by timing line 63, first latched signal 44 holds the logic one level when input data signal 22 transitions to logic zero. Similarly, second latched signal 46 follows input data signal 22 during logic one periods of complimentary feedback signal 48.

Odd data output signal 54 and even data output signal 56 are produced from first latched signal 44 and second latched signal 46, respectively. First master/slave flip-flop 50 samples first latched signal 44 at terminal D during the transition of complimentary feedback signal 48. The sampled signal is coupled to the output terminal Q during the next transition of complimentary feedback signal 48. Timing line 64 illustrates odd data output signal 54 transitioning to a logic zero as the sampled signal is coupled to the output terminal Q. In a similar manner, second master/slave flip-flop 52 produces even data output signal 56 during alternate transitions of feedback signal 28, as shown by timing line 65. As further shown in FIG. 3, odd data output signal 54 contains data consistent with the odd numbered data bits of input data signal 22, while even data output signal 56 contains data consistent with even number data bits of input data signal 22. The even and odd data output signals can be combined in a serial-to-parallel converter to reconstruct the original data. The operation of the serial-to-parallel converter will be discussed with reference to FIG. 9.

Phase information 24 is produced from first latched signal 44 and second latched signal 46 by first exclusive OR (XOR) gate 58, as shown by timing lines 66 and 67. The width of the pulses will be proportional to the phase difference between the transition of input data signal 22 and the transition of feedback signal 28. The phase detector will adjust the phase of feedback signal 28 to maintain the transitions in the center of input data signal 22, thus, when phase locked, each phase information logic one pulse will be equal to one-half bit period.

Transition information 26 is produced from odd data output signal 54 and even data output signal 56 by second XOR gate 60, as shown by timing lines 68 and 69. Transition information 26 will remain at logic one as long as a data transition is detected once each bit period. Each transition information 26 logic transition is an integer multiple of one bit period and, due to the XOR gate function, will be shifted from phase information 24 pulses by one and one-half bit periods (150 picoseconds at 10 gigabits per second) when phase locked. In an alternate embodiment using latches in place of first master-slave flip-flop 50 and second master-slave flip-flop 52, the transition information is shifted, relative to the phase information, by one-half bit period (50 picoseconds at 10 gigabits per second). The delay insensitive architecture of the preferred embodiment of the present invention does not require phase and transition alignment and can tolerate the timing shift between the phase and transition information.

Figure 4:
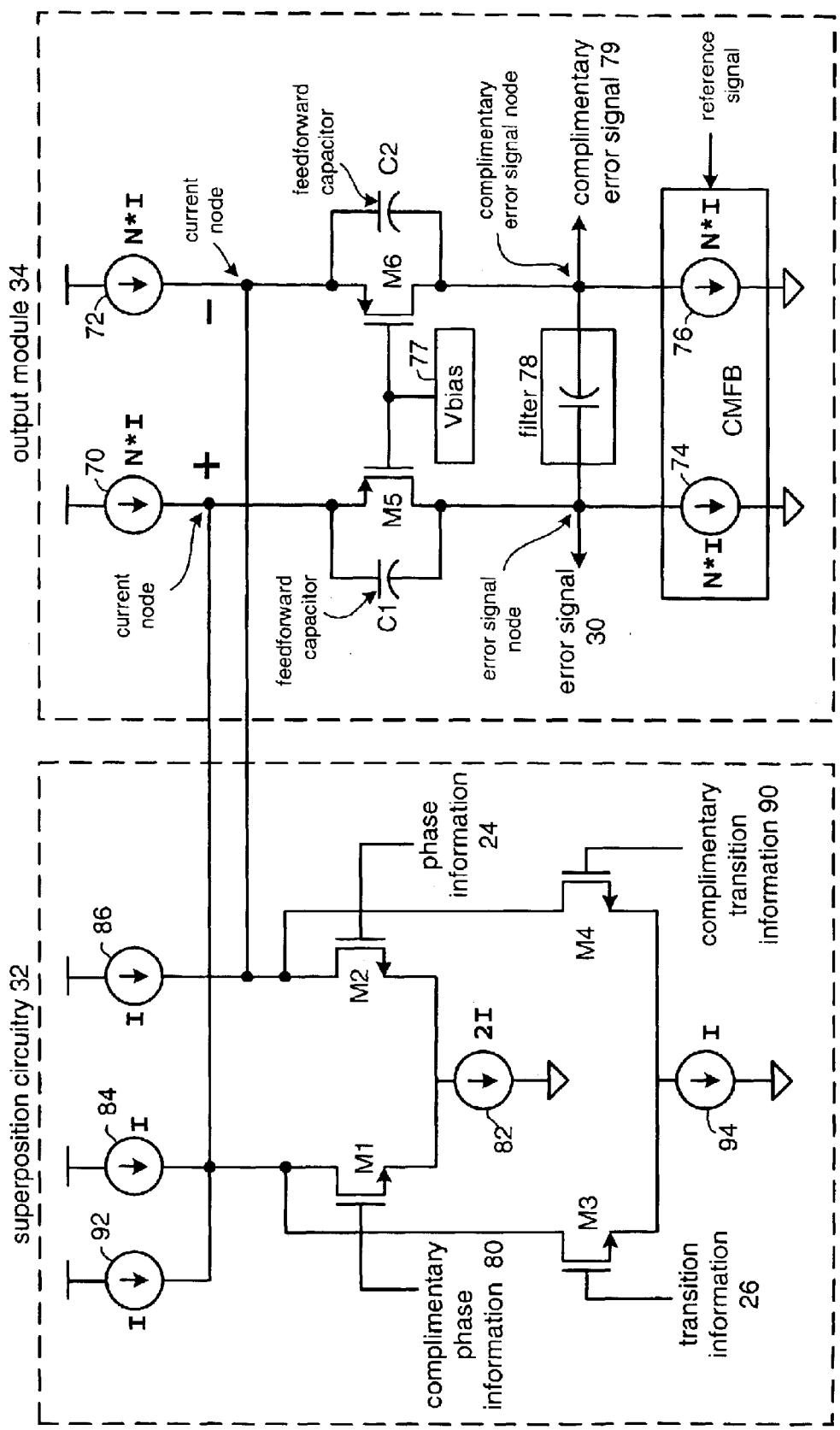
FIG. 4 illustrates a schematic block diagram of a charge pump of the clock recovery circuit of FIG. 1.

FIG. 4 illustrates a schematic block diagram of charge pump 16 of the clock recovery circuit of FIG. 1. Charge pump 16 comprises superposition circuitry 32 and output module 34 coupled to receive phase information 24 and transition information 26 from a phase detector and to generate error signal 30 to an external oscillator module or other device. Superposition circuitry 32 is formed to sink and source current to output module 34 based on the logic levels of phase information 24 and transition information 26.

As shown in FIG. 4, superposition circuitry 32 includes current sources 84 and 92 coupled to output module 34 and to the drain terminals of MOS transistors M1 and M3. Superposition circuitry 32 further includes current source 86 coupled to output module 34 and to the drain terminals of MOS transistors M2 and M4. MOS transistors M1 and M2 have source terminals coupled to current sink 82. The source terminals of MOS transistors M3 and M4 are coupled to current sink 94. The gate terminal of MOS transistor M2 is coupled to receive the phase information 24, while the gate terminal of MOS transistor M1 is coupled to receive the complimentary phase information 80. The gate terminal of MOS transistor M4 is coupled to receive complimentary transition information 90, while the gate terminal of MOS transistor M3 is coupled to receive the transition information 26. As configured, MOS transistors M1–M4 of superposition circuitry 32 will steer current into or out of output module 34 responsive to the phase and transition information. The operation of superposition circuitry will be more fully explained with reference to FIGS. 5–8.

Output module 34 receives and converts superposition circuitry 32 current components into error signal 30 and complimentary error signal 79. A plurality of current sources, namely current sources 70–76 of output module 34, conducts current through bias MOS transistors M5 and M6 to shift the common mode of error signal 30 and complimentary error signal 79 using a reference signal. In general, current sources 70–76 conduct "N" (a whole number) times more current than the "I" current sources of superposition circuitry 32. In the present embodiment, "N" is equal to five.

Current source 70 is connected to the source terminal of bias MOS transistor M5 and to a first terminal of feedforward capacitor C1. The drain terminal of bias MOS transistor M5 and a second terminal of feedforward capacitor C1 are coupled to the error signal node of filter 78 and to current source 74. Similarly, current source 72 is connected to the source terminal of bias MOS transistor M6 and to feedforward capacitor C2. The drain terminal of bias MOS transistor M6 and a second terminal of feedforward capacitor C2 are coupled to the complimentary error signal node of filter 78 and to current source 76. The gate terminals of bias MOS transistors M5 and M6 are coupled to biasing circuitry Vbias 77. Feedforward capacitors C1 and C2, coupled from the source terminals to drain terminals of bias MOS transistors M5 and M6, provide a low impedance path that bypasses most of the high frequency current around bias MOS transistors M5 and M6.

The transfer function zero created by feedforward capacitors C1 and C2 tends to cancel a pole at the positive and negative current nodes. By adding the feedforward capacitors to provide an alternate path for high frequency current components, the charge pump output current is independent of the input data pattern, thus overcoming a problem with the prior art. Filter 78 provides a transimpedance function by charging and discharging in response to the current components of superposition circuitry 32.

The voltage developed across filter 78 is provided as error signal 30 and as complimentary error signal 79 to controlled oscillation module 18 (not shown in FIG. 4). The oscillating frequency of controlled oscillation module 18 will change in response to a change in the error signal voltage thereby changing feedback signal 28 (not shown in FIG. 4) which, in turn, adjusts the phase information produced by phase detector 14 (not shown in FIG. 4). The operation of phase detector 14 was discussed with reference to FIG. 2.

Figure 5:
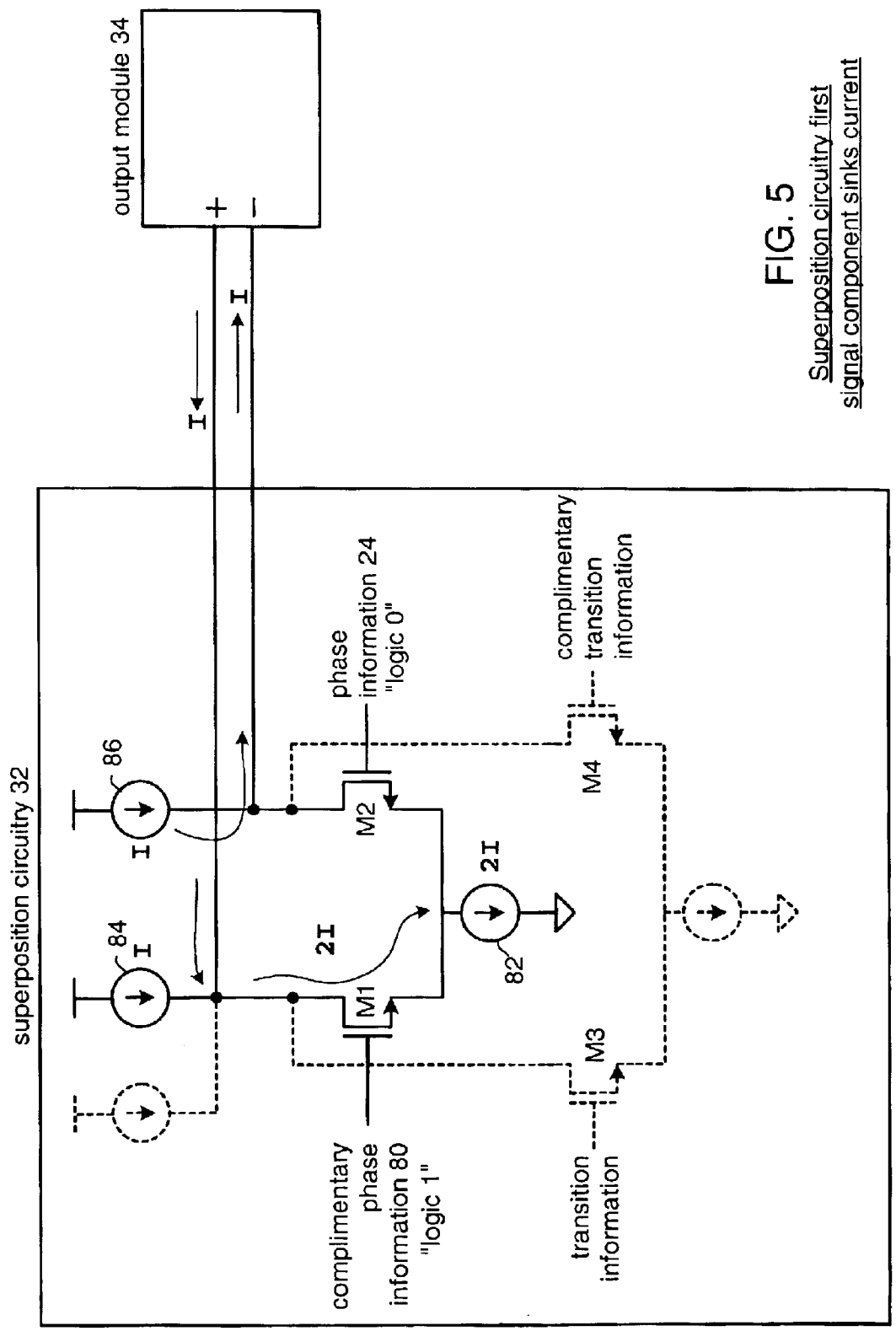
FIG. 5 illustrates the superposition circuitry of the charge pump of FIG. 4 generating a first signal component.

FIG. 5 illustrates the superposition circuitry of the charge pump of FIG. 4 generating a first signal component. As is known by one of average skill in the art, the superposition theorem says that the effects of independent sources in a linear network can be calculated by adding the contribution of each independent source acting alone. The effects of the phase information and transition information on superposition circuitry 32 can be evaluated separately with filter 78 of output module 34 functioning as a summing junction. Continuing with the discussion of FIG. 5, the first signal component is generated when phase information 24 is logic zero and complimentary phase information 80 is logic one. In this mode, the transition circuitry is inactive and shown as dashed lines in FIG. 5. Since phase information 24 is logic zero, MOS transistor M2 is not conducting. MOS transistor M1, by virtue of complimentary phase information 80 being logic one, is conducting a current of 2I to current source (sink) 82. Current source 84 conducts I current so output module 34 must supply the additional I current. In other words, superposition circuitry 32 sinks current from output module 34. Current source 86 conducts current into the negative terminal since this is a differential circuit, though one of average skill in the art should realize the superposition circuitry may be implemented as a single-ended circuit.

Figure 6:
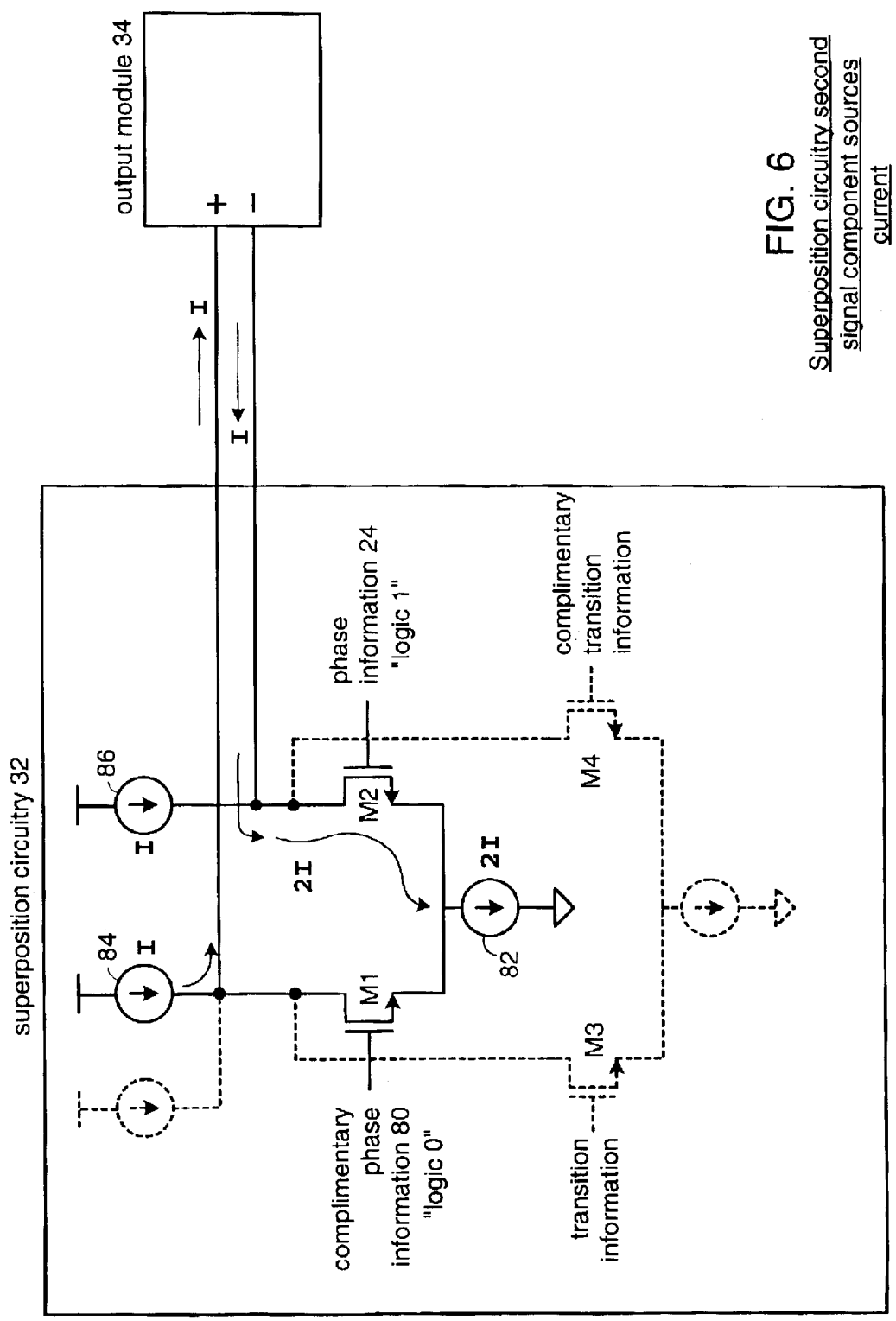
FIG. 6 illustrates the superposition circuitry of the charge pump of FIG. 4 generating a second signal component.

FIG. 6 illustrates the superposition circuitry of the charge pump of FIG. 4 generating a second signal component. Phase information 24 is logic one so complimentary phase information 80 is logic zero. MOS transistor M1 is turned off due to the logic zero coupled to its gate terminal. Current conducted by current source 84 is sourced to output module 34. MOS transistor M2 conducts 2I current due to the logic one applied to its gate terminal. Because current source 86 only supplies I current, the negative terminal of output module 34 supplies I current consistent with the differential operation of this circuit to balance the 2I current generated by current source (sink) 82. In other words, superposition circuitry 32 sources current to output module 34.

Figure 7:
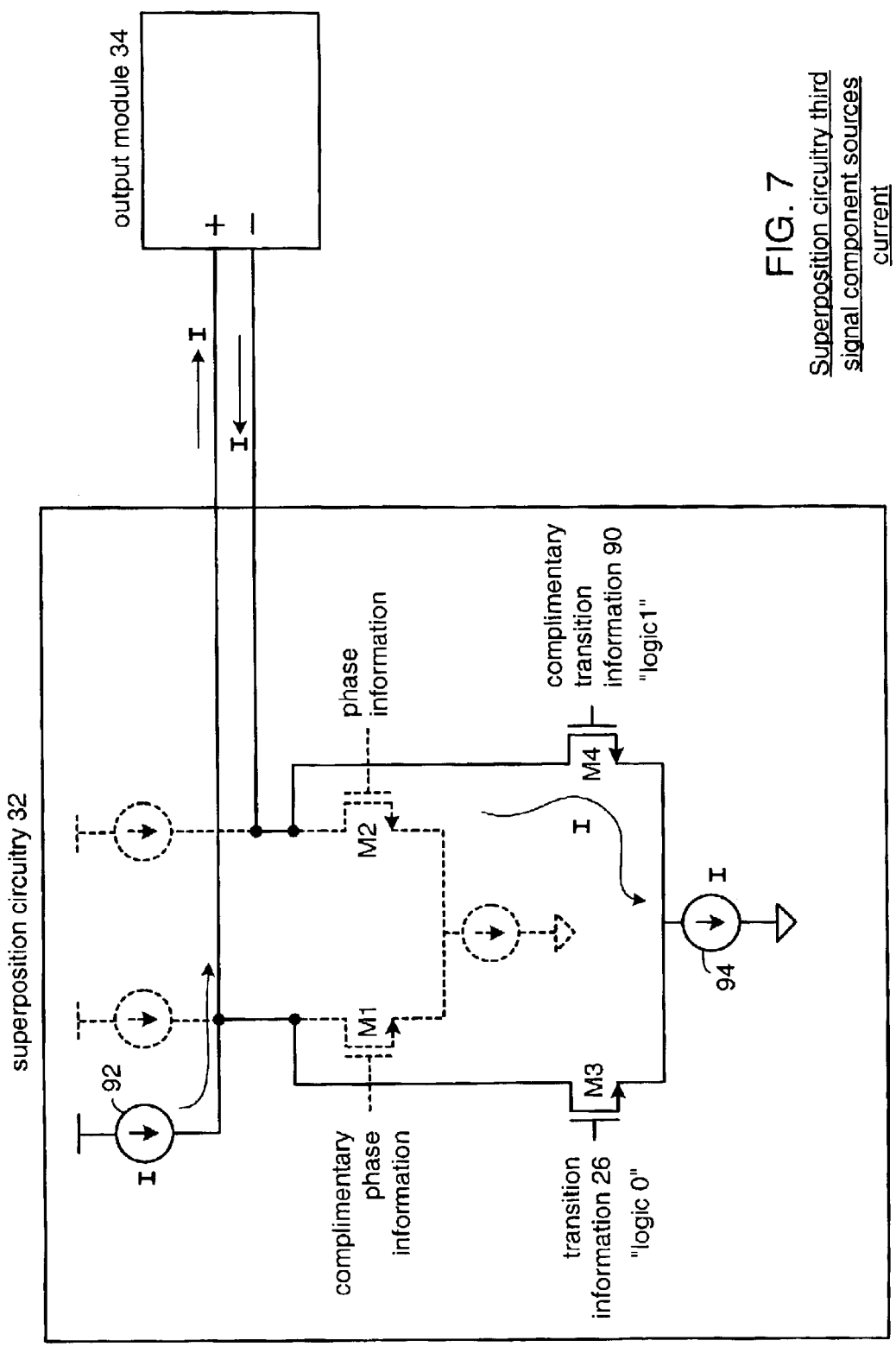
FIG. 7 illustrates the superposition circuitry of the charge pump of FIG. 4 generating a third signal component.

FIG. 7 illustrates the superposition circuitry of the charge pump of FIG. 4 generating a third signal component. In this mode of operation, the transition circuitry is active while the phase circuitry is inactive and therefore shown as dashed lines. Transition information 26 is logic zero while complimentary transition information 90 is logic one. When transition information 26 is logic zero, MOS transistor M3 is off. Current source 92 sources I current to output module 34. MOS transistor M4, turned on by logic one of complimentary transition information 90 coupled to the gate, conducts current I from output module 34 negative terminal to current source 94 coupled to the source terminal. In other words, superposition circuitry 32 sources current to output module 34.

Figure 8:
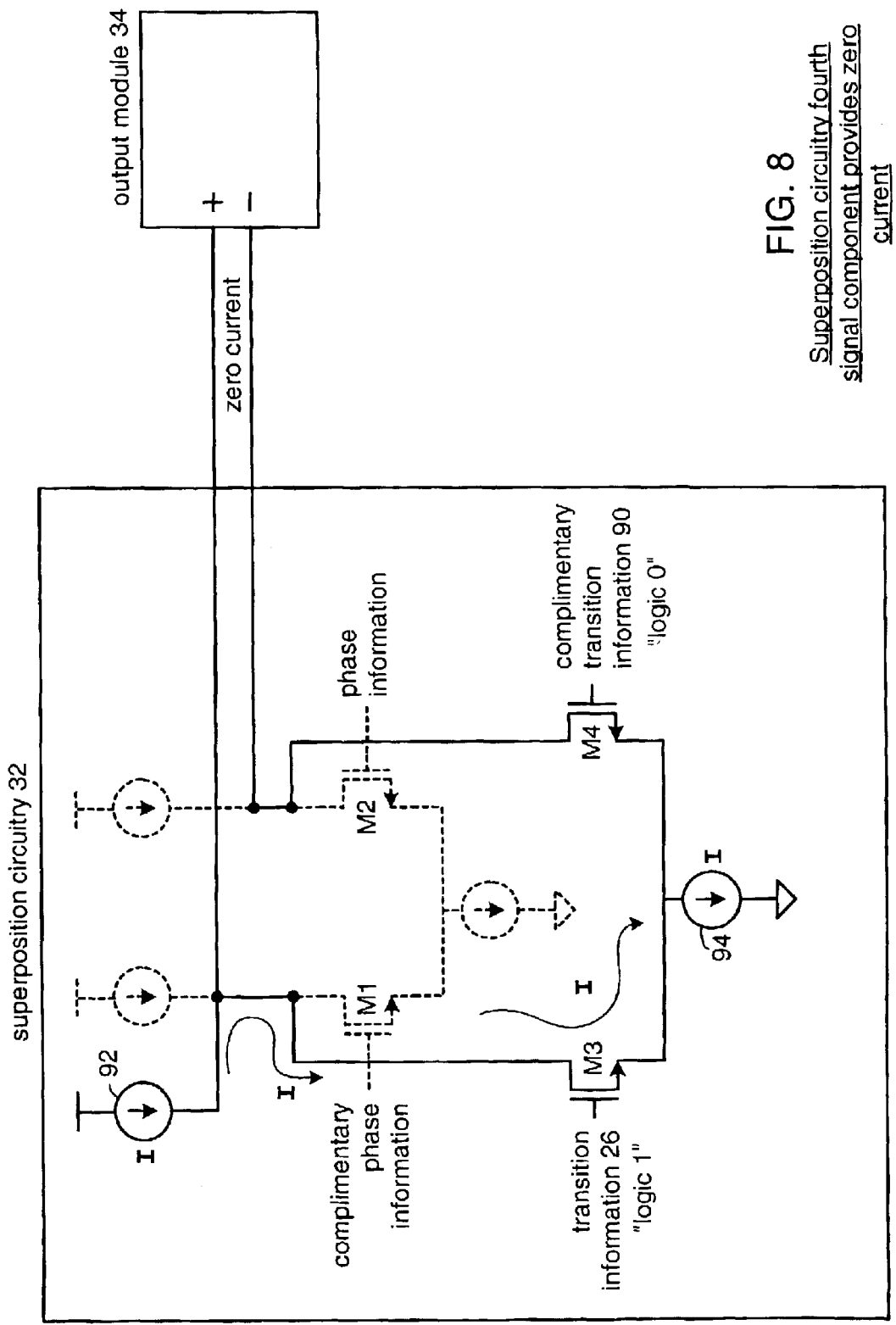
FIG. 8 illustrates the superposition circuitry of the charge pump of FIG. 4 generating a fourth signal component.

FIG. 8 illustrates the superposition circuitry of the charge pump of FIG. 4 generating a fourth signal component. Transition information 26 is at logic, one turning on MOS transistor M3, while complimentary transition information 90 is at logic zero turning off MOS transistor M4. MOS transistor M3 conducts I current supplied by current source 92 so the superposition circuitry provides zero current to output module 34.

In operation, the individual outputs of superposition circuitry 32 combine to produce sinking and sourcing currents to output module 34 responsive to the logic levels of both phase information 24 and transition information 26. Specifically, when transition information 26 is logic one, superposition circuitry 32 will sink "I" current when phase information is logic zero and source "I" current when phase information 24 is logic one. Sinking "I" current from output module 34 removes charge current from filter 78 thereby lowering the voltage developed across filter 78. Conversely, sourcing "I" current to output module 34 increases the voltage developed across filter 78. When transition information 26 is logic zero, superposition circuitry 32 will source "2I" current when phase information 24 is logic one and will provide zero current when phase information 24 is logic zero. The "2I" source current will double the voltage developed across filter 78 as compared to the "I" source current. While it appears that phase information 24 has twice the effect of transition information 26 ("2I" vs. "I"), the pulse width of phase information 24 is, when phase locked, one-half the pulse width of transition information 26, so transition information 26 charges filter 78 for a longer period of time thus producing an equivalent voltage. Because phase information 24 and transition information 26 are not necessarily aligned, superposition circuitry 32 may over charge filter 78 during one period and may under charge during another period. Overtime, however, the average charge will be zero when phase locked. This non-instantaneous response approach allows the inventive circuitry to be delay insensitive. As one of average skill in the art can appreciate, the superposition circuitry 32 may sink or source too much current during one period and may sink or source too little during another period. Over time, however, the average current produced by the superposition circuitry 32 will be zero when phase locked. The inventive superposition circuitry 32 works in conjunction with the inventive phase detector to provide signal delay insensitive operation. As is described herein, the phase and transition signals are not necessarily generated simultaneously by design (50 and 150 picosecond offsets according to described embodiment). The superposition circuitry, by nature of its design, is able to sink or source current independently (i.e., respond to phase and transition signaling independently) to provide frequency and phase error correction. Thus, the preferred embodiment avoids erroneous frequency and phase compensation on average instead of attempting to provide instantaneous frequency and phase error correction thus rendering the overall circuit delay insensitive and overcoming obstacles found in the prior art (No alignment of the phase and transition signal, or post processing of the error signal is required).

Figure 9:
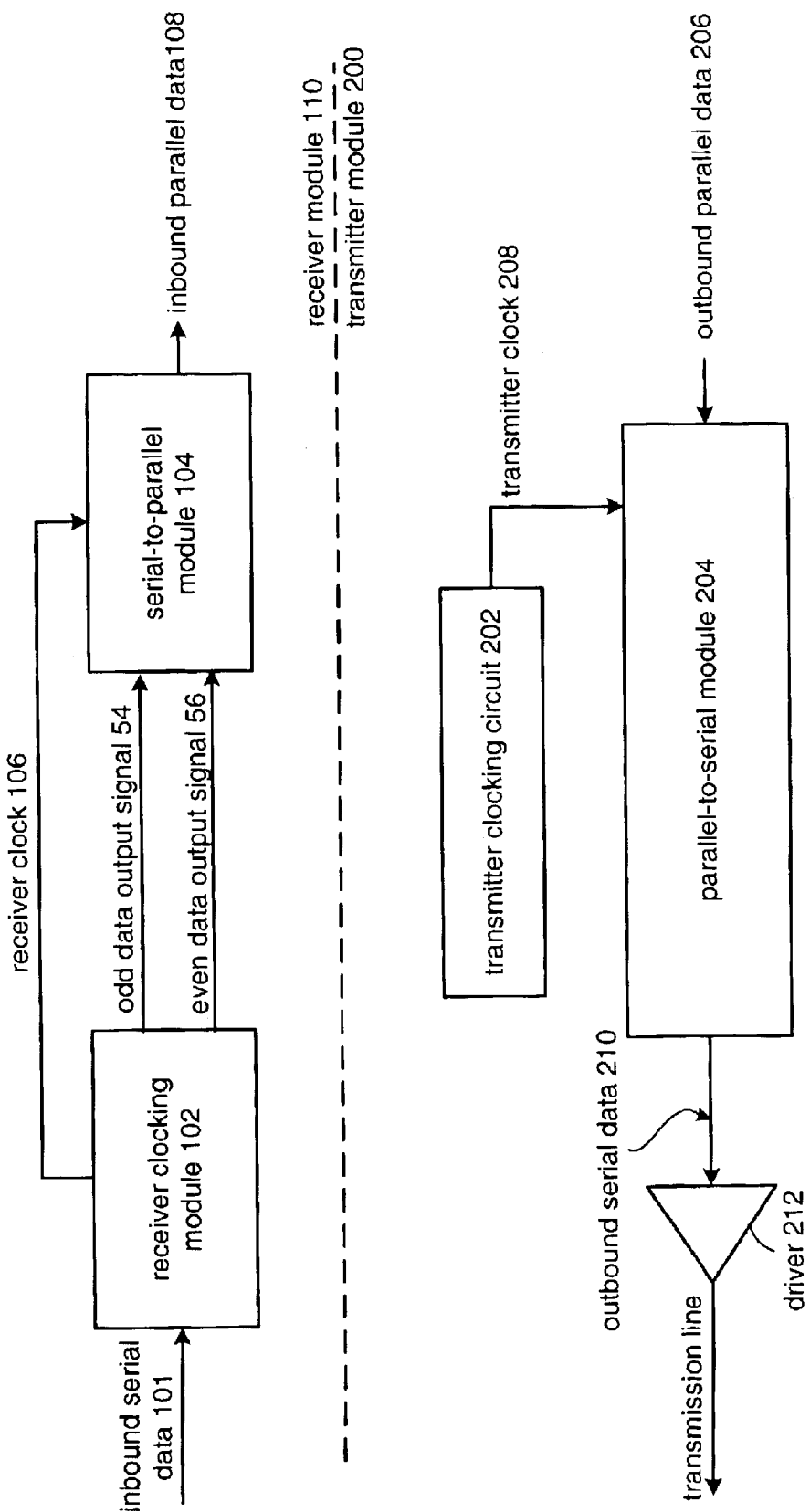
FIG. 9 illustrates a schematic block diagram of a transceiver in accordance with the present invention.

FIG. 9 illustrates a schematic block diagram of a transceiver 100 that includes a receiver module 110 and transmitter module 200. Receiver module 110 includes a receiver clocking module 102 and a serial-to-parallel module 104. Transmitter module 200 includes a transmitter clocking circuit 202, a parallel-to-serial module 204, and a driver 212.

In operation, the receiver module 110 is operably coupled to receive an inbound serial data 101 via the receiver clocking module 102. The receiver clocking module 102, which will be discussed with reference to FIG. 10, generates at least one receiver clock 106. Serial-to-parallel module 104 receives an odd data output signal 54, comprising serial odd data, and an even data output signal 56, comprising serial even data, from receiver clocking module 102 and converts the received serial data into inbound parallel data 108 based on the at least one receiver clock 106. The inbound parallel data 108 is clocked out of serial-to-parallel module 104 at a parallel data rate significantly slower than the at least one receiver clock 106. Accordingly, serial-to-parallel module 104 will divide the at least one receiver clock 106 into a plurality of lower data rate clocks to meet the required parallel data rate. Due to the difference in the serial data rate and the parallel data rate, serial-to-parallel module 104 typically stores the incoming serial data in an internal buffer or similar memory, device prior to conversion. As one of average skill in the art will appreciate, the serial input and parallel output may be single-ended or differential signals.

Parallel-to-serial module 204 is operably coupled to receive outbound parallel data 206 and, based on at least one transmitter clock 208, produces outbound serial data 210. Driver 212 contains circuitry to drive a transmission line as well as providing isolation between the parallel-to-serial module 204 and the transmission line. As one of average skill in the art will appreciate, the parallel input and serial output may be single-ended or differential signals. As one of average skill in the art will further appreciate, transmitter clocking circuit 202 may be comprised of clock recovery circuit 10 to generate the transmitter clock 208.

Figure 10:
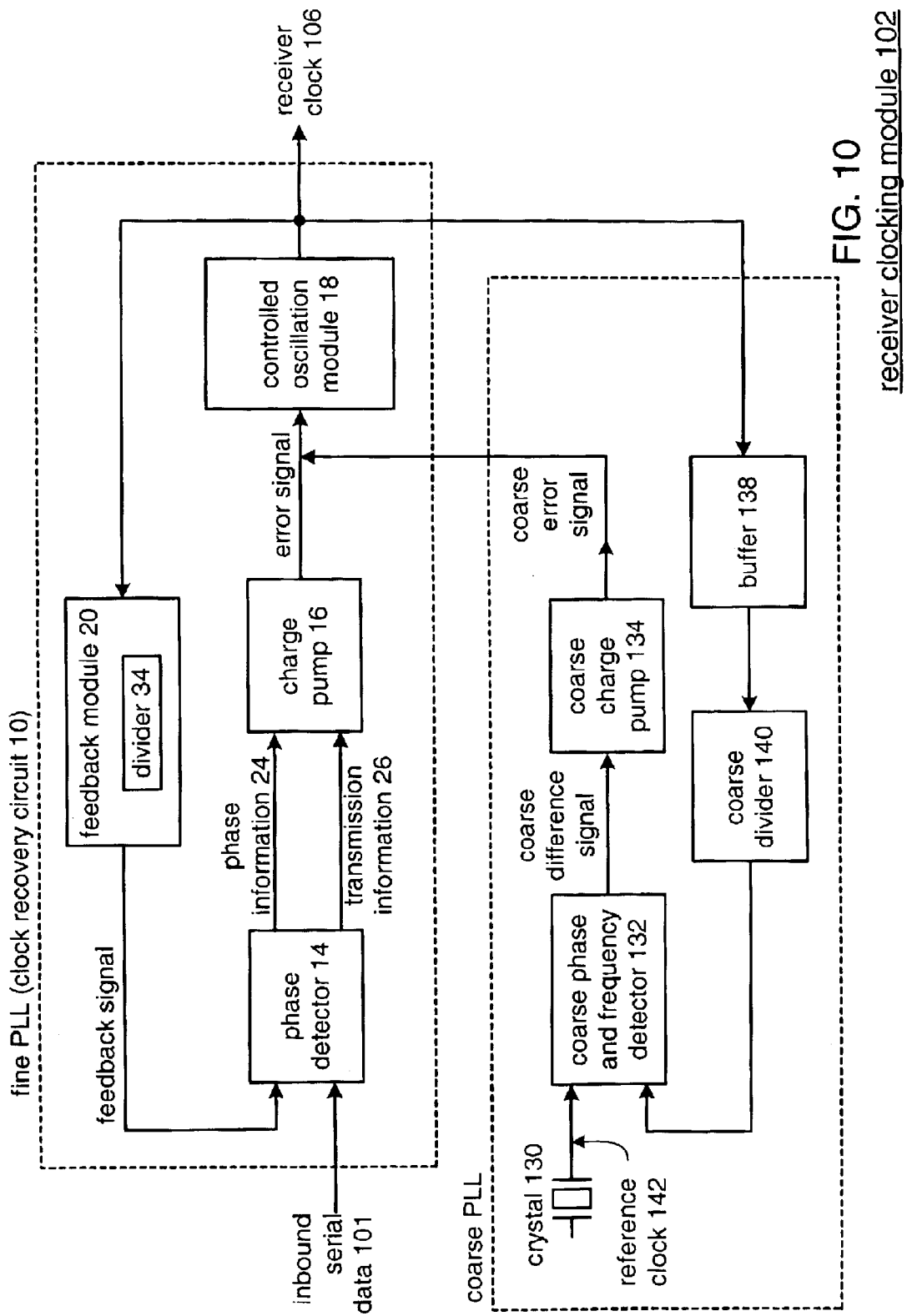
FIG. 10 illustrates a schematic block diagram of a receiver clock recovery module of the transceiver of FIG. 9.

FIG. 10 illustrates a schematic block diagram of receiver clocking module 102 of the transceiver of FIG. 9. The receiver clocking module 102 includes two phase locked loops (PLLs): a coarse PLL and a fine PLL comprising clock recovery module 10. In general, the coarse PLL establishes the desired frequency for the clocking circuit and the fine PLL adjusts the phase of the clock and it will also adjust a limited frequency offset to align it with the incoming data. In the present embodiment of the invention, the feedback signal frequency is one-half the frequency of the incoming data. The coarse PLL includes a crystal 130, a coarse phase and frequency detector 132, a coarse charge pump 134, a buffer 138, and a coarse divider 140. The fine PLL, comprising clock recovery module 10 was described with reference to FIG. 1.

To establish the operating frequency for the clocking circuit, crystal 130 produces a reference clock 142 that is provided to the coarse phase and frequency detector 132. The coarse phase and frequency detector 132 determines the phase and frequency difference between the reference clock 142 and a divided representation of receiver clock 106. The coarse divider 140 provides the divided representation of the receiver clock 106 to the coarse phase and frequency detector 132. Based on the phase and frequency relationship of these signals, coarse phase and frequency detector 132 produces a coarse difference signal. Coarse charge pump 134 receives the coarse difference signal and produces a current representation (which is converted to voltage through the Transimpedance included at the output of the Fine Loop CP) thereof and provides a coarse error signal to controlled oscillation module 18. Controlled oscillation module 18 receives the coarse error signal and, adjusts the oscillation frequency of receiver clock 106. Once the coarse PLL has established the operating frequency, the fine PLL becomes active and adjusts the phase of the receiver clock.

Controlled oscillation module 18 may utilize inductor-capacitor oscillators to produce an output oscillation. By utilizing inductor-capacitor oscillators in comparison to ring oscillators, the noise levels of controlled oscillation module 18 are reduced.

As illustrated, receiver clocking module 102 includes two phase locked loops, one is a fine phase locked loop based on the data and the other is a coarse phase locked loop based on reference clock 142. Such sequential phased locked loop enables the receiver section to readily capture the inbound serial data. As one of average skill in the art will appreciate, receiver clocking module 102 may use single-ended signals or differential signals.

Figure 11:
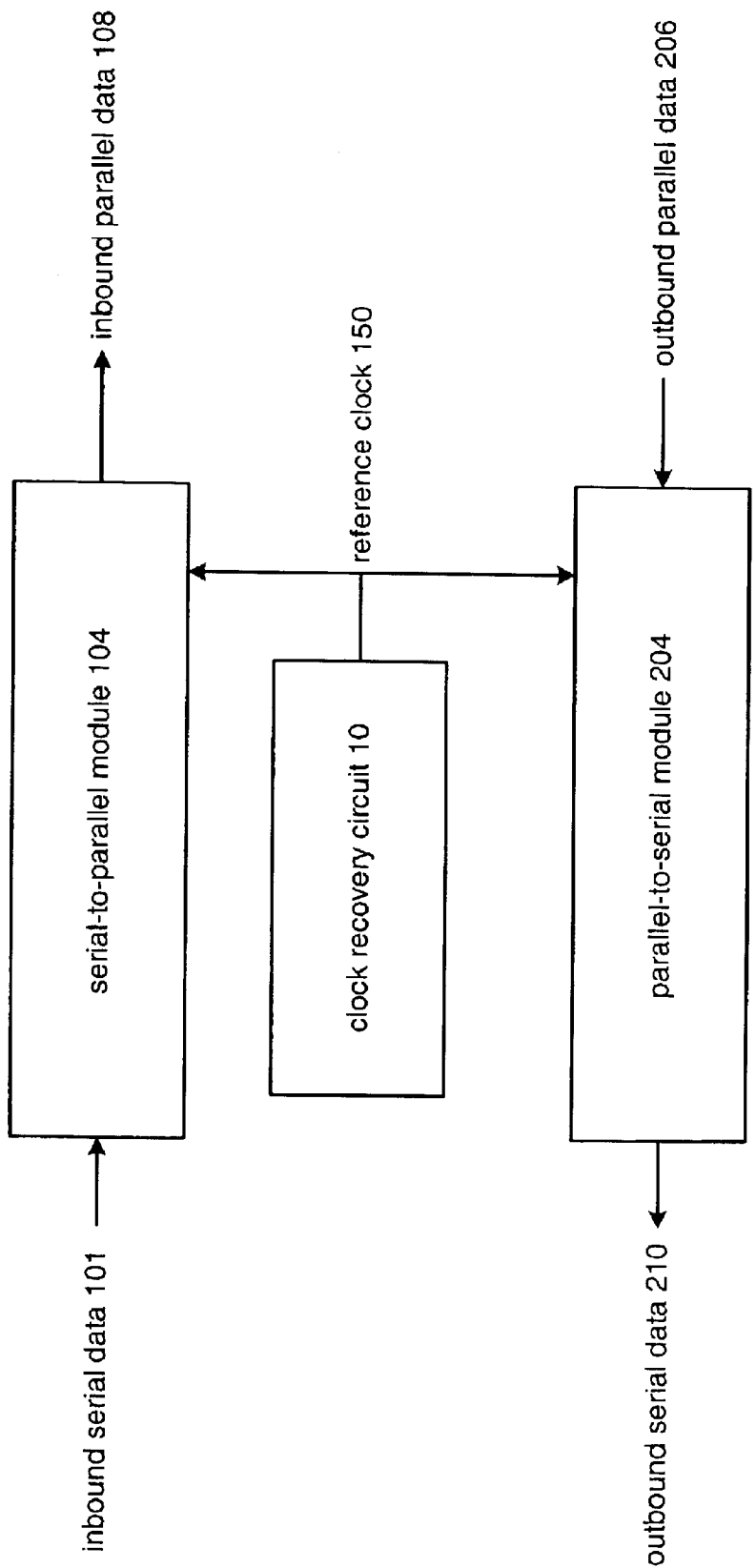
FIG. 11 illustrates an alternate embodiment of the transceiver.

FIG. 11 illustrates an alternate embodiment of transceiver 100 that includes serial-to-parallel module 104, parallel-to-serial module 204, and clock recovery circuit 10. In operation, the clock recovery circuit 10 may be implemented as the transmitter clocking circuit 202 illustrated in FIG. 9 or, a portion thereof, and/or a combination thereof to produce at least one reference clock 150. The at least one reference clock 150 is provided to both the serial-to-parallel module 104 and the parallel-to-serial module 204.

The serial-to-parallel module 104 receives inbound serial data 101 and produces inbound parallel data 108 therefrom. The parallel-to-serial module 204 receives outbound parallel data 206 and produces outbound serial data 210 therefrom.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A clock recovery circuit comprises:
   phase detector operably coupled to produce phase information and transition information based on a feedback signal and an input data signal;
   charge pump operably coupled to generate an error signal based on the phase information and the transition information;
   controlled oscillation module operably coupled to convert the error signal into an oscillating signal; and
   feedback module operably coupled to generate the feedback signal based on the oscillating signal and a divider value;
   wherein the charge pump:
      generates a first signal component when the phase information is in a first state;
      generates a second signal component when the phase information is in a second state;
      generates a third signal component when the transition information is in a first state;
      generates a fourth signal component when the transition information is in a second state; and
      generates the error signal based on the first, second, third, and fourth signal components.

2. The clock recovery circuit of claim 1, wherein the charge pump further comprises:

superposition circuitry, operably coupled to receive the phase information and transition information generated with an offset relative to each other wherein the superposition circuitry generates the first, second, third, and fourth signal components as current components therefrom to provide accurate frequency and phase correction on average rather than instantaneously and further wherein a delay in one or both of the phase and transition information does not adversely affect the accuracy of the frequency and phase correction on average rendering the superposition circuitry delay insensitive; and an output module operably coupled to generate the error signal from the current components and further coupled to shift common mode of the error signal, wherein the output module has a bandwidth greater than a data rate.

3. The clock recovery circuit of claim 2, wherein the superposition circuitry sinks current as the first signal component from the output module when the phase information is a logic zero.

4. The clock recovery circuit of claim 2, wherein the superposition circuitry sources current as the second signal component to the output module when the phase information is a logic one.

5. The clock recovery circuit of claim 2, wherein the superposition circuitry sources current as the third signal component to the output module when the transition information is a logic zero.

6. The clock recovery circuit of claim 2, wherein the superposition circuitry provides zero current as the fourth signal component when the transition information is a logic one.

7. The clock recovery circuit of claim 2, wherein the output module further includes feedforward capacitors operably coupled to bypass high frequency current components.

8. The clock recovery circuit of claim 1, wherein the phase detector further comprises:
   a first latch operably coupled to latch the input data signal based on the feedback signal to produce a first latched signal;
   a first master/slave flip-flop operably coupled to latch the first latched signal based on a complimentary feedback signal to produce an odd data output signal;
   a second latch operably coupled to latch the input data signal based on the complimentary feedback signal to produce a second latched signal;
   a second master/slave flip-flop operably coupled to latch the second latched signal based on the feedback signal to produce an even data output signal; and
   logic operably coupled to the first latch, second latch, first master/slave flip-flop, and second master/slave flip-flop to produce the phase information and the transition information.

9. The clock recovery circuit of claim 1, wherein the charge pump comprises:
   a plurality of current sources for generating a first amount of current;
   a first current sink for sinking for sinking a second amount of current;
   a second current sink for sinking a third amount of current;
   selectable switch circuitry coupled between the plurality of current sources and first and second current sinks to control how much current from the plurality of current sources is produced to the first and second current sinks; and an output module coupled between the plurality of current sources and the first and second current sinks for sourcing and sinking current responsive to the selectable switch circuitry.

10. The clock recovery circuit of claim 1 further comprises an analog front end (AFE) operably coupled to receive a serial data stream and to produce therefrom the input data signal.

11. A clock recovery circuit comprises:
   phase detector operably coupled to produce phase information and transition information based on a feedback signal and an input data signal, the phase detector further including:
      first latch operably coupled to latch the input data signal based on the feedback signal to produce a first latched signal;
      first master/slave flip-flop operably coupled to latch the first latched signal based on a complimentary feedback signal to produce an odd data output signal;
      second latch operably coupled to latch the input data signal based on the complimentary feedback signal to produce a second latched signal;
      second master/slave flip-flop operably coupled to latch the second latched signal based on the feedback signal to produce an even data output signal; and
      logic operably coupled to the first latched signal, second latched, odd data output signal, and even data output signal to produce the phase information and the transition information;
   charge pump operably coupled to generate an error signal based on the phase information and the transition information;
   controlled oscillation module operably coupled to convert the error signal into an oscillating signal; and
   feedback module operably coupled to generate the feedback signal based on the oscillating signal and a divider value.

12. The clock recovery circuit of claim 11, wherein the feedback module functions to maintain the feedback signal at one-half an input data signal data rate.

13. The clock recovery circuit of claim 11, wherein the charge pump further functions to:
   generate a first signal component when the phase information is in a first state;
   generate a second signal component when the phase information is in a second state;
   generate a third signal component when the transition information is in a first state;
   generate a fourth signal component when the transition information is in a second state; and
   generate the error signal based on the first, second, third, and fourth signal components.

14. The clock recovery circuit of claim 11, wherein the charge pump further comprises:
   superposition circuitry, operably coupled to receive the phase information and transition information generated with an offset relative to each other wherein the superposition circuitry generates the first, second, third, and fourth signal components as current components therefrom to provide accurate frequency and phase correction on average rather than instantaneously and further wherein a delay in one or both of the phase and transition information does not adversely affect the accuracy of the frequency and phase correction on average rendering the superposition circuitry delay insensitive; and an output module operably coupled to generate the error signal from the current components and further coupled to shift common mode of the error signal, wherein the output module has a bandwidth greater than the input data signal data rate.

15. The clock recovery circuit of claim 14, wherein the superposition circuitry sinks current as the first signal component from the output module when the phase information is a logic zero.

16. The clock recovery circuit of claim 14, wherein the superposition circuitry sources current as the second signal component to the output module when the phase information is a logic one.

17. The clock recovery circuit of claim 14, wherein the superposition circuitry sources current as the third signal component to the output module when the transition information is a logic zero.

18. The clock recovery circuit of claim 14, wherein the superposition circuitry provides zero current as the fourth signal component when the transition information is a logic one.

19. The clock recovery circuit of claim 14, wherein the output module further includes feedforward capacitors operably coupled to bypass high frequency current components.

20. The clock recovery circuit of claim 11, wherein the charge pump comprises:
a plurality of current sources for generating a first amount of current;
a first current sink for sinking a second amount of current;
a second current sink for sinking a third amount of current;
selectable switch circuitry coupled between the plurality of current sources and first and second current sinks to control how much current from the plurality of current sources is produced to the first and second current sinks; and
an output module coupled between the plurality of current sources and the first and second current sinks for sourcing and sinking current responsive to the selectable switch circuitry.

21. The clock recovery circuit of claim 11, further including an analog front end (AFE), operably coupled to receive a serial data stream and to produce therefrom the input data signal.

22. A transceiver comprising:
transmitter module for transmitting data, wherein the transmitter module includes:
transmitter clocking module operably coupled to produce at least one transmitter clock;
parallel to serial module operably coupled to convert outbound parallel data into outbound serial data at a rate corresponding to the at least one transmitter clock; and
output driver operably coupled to drive the outbound serial data on to a transmission line;
receiver module for receiving inbound serial data, wherein the receiver module includes:
analog front end for receiving inbound serial data operably coupled to amplify the received serial data to produce amplified inbound serial data;
clock recovery module operably coupled to recover a clock signal from the amplified inbound serial data and to extract serial even data and serial odd data from the inbound serial data and to produce at least one receiver clock;
serial to parallel module operably coupled to convert the serial even data and serial odd data into inbound parallel data at a rate corresponding to the at least one receiver clock;
wherein the clock recovery module further comprises:
phase detector operably coupled to produce phase information and transition information based on a phase difference between the amplified inbound serial data and a feedback signal that is representative of the at least one receiver clock;
charge pump operably coupled to generate an error signal based on the phase information and transition information, wherein the charge pump:
generates a first signal component when the phase information is in a first state;
generates a second signal component when the phase information is in a second state;
generates a third signal component when the transition information is in a first state;
generates a fourth signal component when the transition information is in a second state; and
generates the error signal based on the first, second, third, and fourth signal components; controlled oscillation module operably coupled to convert the error signal into the at least one receiver clock; and
feedback module operably coupled to generate the feedback signal based on the at least one receiver clock and a divider value.

23. The transceiver of claim 22, wherein the charge pump further comprises:
superposition circuitry, operably coupled to receive the phase information, and transition information generated with an offset relative to each other wherein the superposition circuitry generates the first, second, third, and fourth signal components as current components therefrom to provide accurate frequency and phase correction on average rather than instantaneously and further wherein a delay in one or both of the phase and transition information does not adversely affect the accuracy of the frequency and phase correction on average rendering the superposition circuitry delay insensitive; and
an output module operably coupled to generate the error signal from the current components and further coupled to shift common mode of the error signal, wherein the output module has a bandwidth greater than an input signal data rate.

24. The transceiver of claim 23, wherein the superposition circuitry sinks current as the first signal component from the output module when the phase information is a logic zero.

25. The transceiver of claim 23, wherein the superposition circuitry sources current as the second signal component to the output module when the phase information is a logic one.

26. The transceiver of claim 23, wherein the superposition circuitry sources current as the third signal component to the output module when the first state of the transition information is a logic zero.

27. The transceiver of claim 23, wherein the superposition circuitry provides zero current as the fourth signal component when the transition information is a logic one.

28. The transceiver of claim 23, wherein the output module further includes feedforward capacitors operably coupled to bypass high frequency current components.

29. The transceiver of claim 23, wherein the output module further includes filter circuitry, coupled between an error signal node and a complimentary error signal node, the filter circuitry to filter the error signal.

30. The transceiver of claim 22, wherein the charge pump comprises:

a plurality of current sources for generating a first amount of current;

a first current sink for sinking for sinking a second amount of current;

a second current sink for sinking a third amount of current;

selectable switch circuitry coupled between the plurality of current sources and first and second current sinks to control how much current from the plurality of current sources is produced to the first and second current sinks; and an output module coupled between the plurality of current sources and the first and second current sinks for sourcing and sinking current responsive to the selectable switch circuitry.

31. A clock recovery circuit comprises:

phase detector operably coupled to produce phase information and transition information based on a feedback signal and an input data signal;

charge pump operably coupled to generate an error signal based on the phase information and the transition information, wherein the charge pump comprises:

a plurality of current sources for generating a first amount of current;

a first current sink for sinking for sinking a second amount of current;

a second current sink for sinking a third amount of current;

selectable switch circuitry coupled between the plurality of current sources and first and second current sinks to control how much current from the plurality of current sources is produced to the first and second current sinks;

wherein the charge pump:

generates a first signal component when the phase information is in a first state;

generates a second signal component when the phase information is in a second state;

generates a third signal component when the transition information is in a first state;

generates a fourth signal component when the transition information is in a second state; and generates the error signal based on the first, second, third, and fourth signal components; and wherein the charge pump further comprises:

superposition circuitry, operably coupled to receive the phase information and transition information generated with an offset relative to each other;

wherein the superposition circuitry generates the first, second, third, and fourth signal components as current components therefrom to provide accurate frequency and phase correction on average rather than instantaneously; and wherein a delay in one or both of the phase and transition information does not adversely affect the accuracy of the frequency and phase correction on average rendering the superposition circuitry delay insensitive.

32. The clock recovery circuit of claim 31 further including an output module operably coupled to generate the error signal from the current components and further coupled to shift common mode of the error signal, wherein the output module has a bandwidth greater than a data rate.

* * * * *